United States Patent
Agarwal et al.

(10) Patent No.: US 7,595,744 B2
(45) Date of Patent: Sep. 29, 2009

(54) CORRECTING OFFSET ERRORS ASSOCIATED WITH A SUB-ADC IN PIPELINE ANALOG TO DIGITAL CONVERTERS

(75) Inventors: Nitin Agarwal, Bangalore (IN); Ramesh Kumar Singh, Bangalore (IN); Visvesvaraya A Pentakota, Bangalore (IN); Dantes John, Bangalore (IN); Supreet Joshi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/945,278

(22) Filed: Nov. 27, 2007

(65) Prior Publication Data
US 2009/0135037 A1  May 28, 2009

(51) Int. Cl.
H03M 1/10 (2006.01)
(52) U.S. Cl. .................. 341/118; 341/156

(58) Field of Classification Search .............. 341/118, 341/120, 156, 161, 162, 163
See application file for complete search history.

(56) References Cited

U.S. PATENT DOCUMENTS

| 4,947,168 | A  | * | 8/1990  | Myers ................ 341/120 |
| 6,323,791 | B1 | * | 11/2001 | Murden et al. ......... 341/118 |
| 6,882,292 | B1 | * | 4/2005  | Bardsley et al. ....... 341/121 |
| 6,882,294 | B2 | * | 4/2005  | Linder et al. .......... 341/154 |
| 7,187,310 | B2 | * | 3/2007  | El-Sankary et al. .... 341/120 |

* cited by examiner

*Primary Examiner*—Howard Williams
(74) *Attorney, Agent, or Firm*—John J. Patti; Wade J. Brady, III; Frederick J. Telecky, Jr.

(57) ABSTRACT

An offset correction circuit examines a residue signal of a stage of a pipeline analog to digital converter (ADC) to determine whether a parameter which could cause offset error, needs to be adjusted. In an embodiment, the parameter is adjusted until a maximum range of the residue signal equals an expected range. In the described examples, the adjusted parameters include timing offset error (when components of an ADC sample the input signal at different time instances) and a voltage offset error (the threshold voltage at which a sub-ADC in a stage the generated sub-code changes to a next value).

11 Claims, 7 Drawing Sheets

CORRECTING OFFSET ERRORS ASSOCIATED WITH A SUB-ADC IN PIPELINE ANALOG TO DIGITAL CONVERTERS

FIELD OF THE INVENTION

The present invention relates generally to Analog to Digital Converters (ADC), and more specifically to correction of offset errors associated with a sub-ADC in analog to digital converters (ADC).

BACKGROUND

Analog to Digital Converters (ADCs) are used to generate a sequence of digital codes representing the strength of an input signal at corresponding time instants. A pipeline ADC is a type of ADC which contains a sequence of (pipeline) stages, with each stage resolving a number of bits forming a sub-code. The sub-codes generated by various stages are used to generate a digital code corresponding to the analog input sampled by the ADC.

A sub-ADC generally refers to an ADC component (contained in a stage of a 'ADC' noted in the above paragraph) that generates a coarse (low-resolution) digital equivalent (sub-code noted above) of the corresponding input to the stage. Each stage (except the last stage) of a pipeline ADC generates a residue signal which is the difference of the input signal and the analog equivalent of the sub-code, the residual signal representing that portion of the input signal that needs to be resolved by subsequent stages. The residue signal represents a difference of the voltage of the input signal to the stage and the voltage value corresponding to the sub-code provided by the stage. The residue signal (in an amplified form, typically) of one stage is provided as an input signal to the next stage in the sequence.

A sub-ADC in a pipeline ADC may be associated with various errors. An offset error is generally present when an operational parameter (affecting the values of the digital codes generated) deviates in an ADC from a corresponding desired value. For example, while it may be desirable that different sub-components of a stage of a pipeline ADC sample the input signal to that stage at a same/identical time instants, the components may not sample the input signal at the same time instant.

Thus, a sub-ADC may sample an input signal at time instants which are offset (different) from the (corresponding) instants at which other components of the stage sample the same input signal. The difference of sampling instants represents a timing offset (also termed sampling mismatch) error. Similarly, it may be desirable that voltage thresholds (the voltage value at which the equivalent digital value changes to a next value) used in a flash ADC of a stage not deviate from desired values, a deviation being termed a voltage offset error.

Such offset errors generally cause corresponding errors in the output digital codes of a pipeline ADC. It is accordingly desirable that offset errors be corrected such that the digital codes accurately represent the strength of an input signal at the sampled time instant.

Several aspects of the present invention correct for offset errors associated with one or more sub-ADCs in a pipeline ADC.

BRIEF DESCRIPTION OF THE DRAWINGS

The present invention will be described with reference to the following accompanying drawings, which are described briefly below.

DETAILED DESCRIPTION

Refer now to the drawings wherein depicted elements are, for the sake of clarity, not necessarily shown to scale and wherein like or similar elements are designated by the same reference numeral through the several views.

An aspect of the present invention corrects offset errors caused by stages of a pipeline analog to digital converter (pipeline ADC). In an embodiment, an offset correction block forms a measure characterizing the deviation of residue values (of a stage) from an expected range of residue values. A parameter is then adjusted to minimize the deviations for subsequently received portion of the input signal. The offset errors may be corrected as a result.

In an embodiment, the offset error corresponds to a timing offset error and the parameter corresponds to a phase of a sampling clock used by the stage of the ADC.

In an embodiment, the offset error corresponds to a voltage offset error and the parameter corresponds to a threshold voltage of a flash ADC used in the stage of a pipeline ADC.

Figure 1:
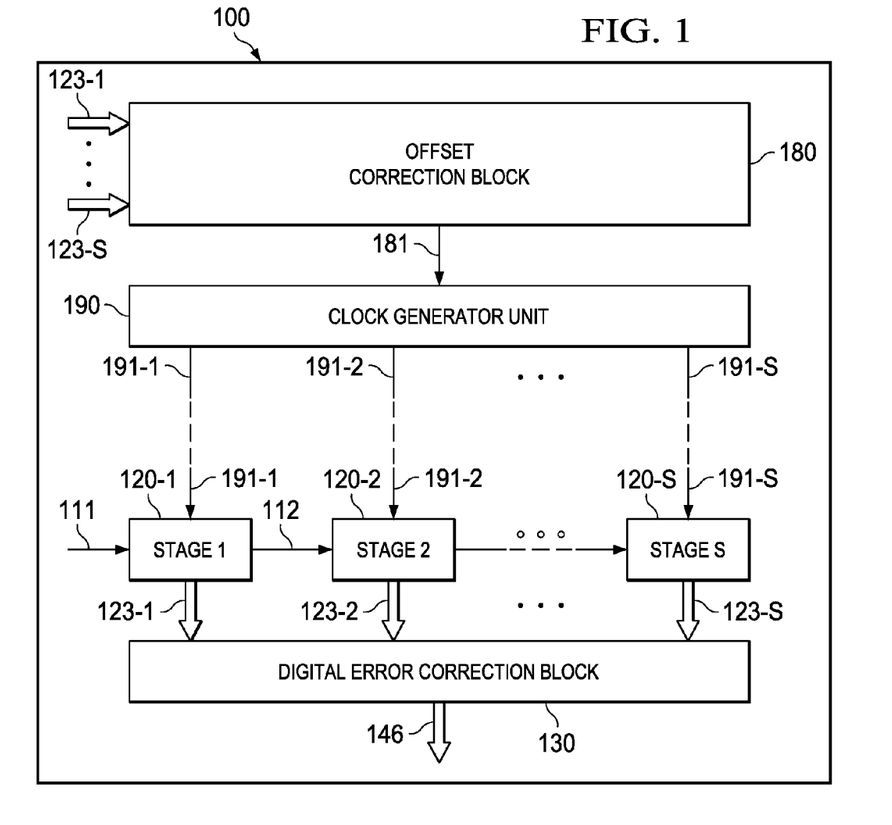
FIG. 1 is a block diagram illustrating the details of a pipeline ADC in an embodiment of the present invention.

FIG. 1 is a block diagram illustrating the details of a pipeline ADC in an embodiment of the present invention. Pipeline ADC 100 is shown containing stages 120-1 through 120-S, digital error correction block 130, offset correction block 180 and clock generation unit 190. Each block is described below in further detail.

Clock generation unit 190 provides clock signals to each stage via paths 191-1 through 191-S. Each of the paths 191-1 through 191-S may contain multiple clock signals used as sampling clock signals to sample a corresponding input signal to each stage. The clock signals determine the sampling instants in the operation of each stage, as will be clear from the description below.

Each stage 120-1 through 120-S generates a sub-code corresponding to a voltage value of an analog signal received as an input, and an amplified residue signal as an input to a (any) next stage. For example, stage 120-1 converts a voltage value on path 111 to generate a sub-code on path 123-1, and the amplified residue signal generated on path 112 is provided as an input to stage 120-2. Thus, each stage (except the last—

120-S) partially resolves the input signal, and generates an unresolved residue to be resolved by a subsequent stage. Stage 120-S resolves the last amplified residue.

Digital error correction block 130 receives sub-codes (123-1 through 123-S) from various stages (121-1 through 121-S), and generates an overall code representing the strength of the sample received on path 111. Conceptually, it may perform a weighted addition of the sub-codes to generate the overall code, as is well known in the relevant arts. The generated overall code is provided on path 146.

Offset correction block 180 operates to correct offset errors in stages 120-1 through 120-S, based on the residue signals generated in various stages. A residue signal represents the unresolved portion of an input signal, as illustrated logically in an example embodiment below.

Figure 2:
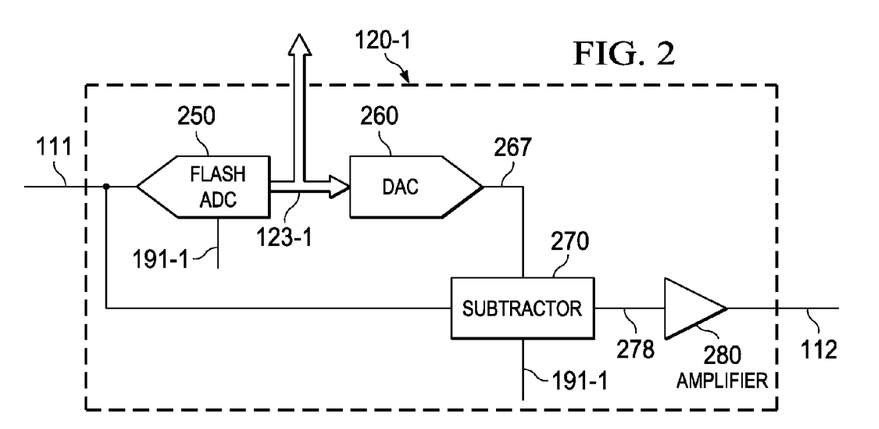
FIG. 2 is a block diagram illustrating the internal details of a stage of a pipeline ADC in an embodiment of the present invention.

FIG. 2 is a block diagram illustrating the internal details of a stage of a pipeline ADC in an embodiment of the present invention. Stage 120-1 of pipeline ADC 100 is shown containing flash ADC 250, digital to analog converter (DAC) 260, subtractor 270 and amplifier 280.

Flash ADC 250, operates as a sub-ADC in stage 120-1, receives a clock signal on path 191-1, and converts a sample of an analog signal received on path 111 at an active edge of clock signal CLK1 into a corresponding sub-code, which is provided on path 123-1. The sub-code is a partially resolved representation of input 111, and may contain, for example, the P most significant bits of the N-bit overall code provided on path 146.

DAC 260 converts the sub-code received on path 123-1 into a corresponding analog signal (Vdac) on path 267. The strength of each portion of the analog signal is generally proportionate to the sub-code.

Subtractor 270 receives a clock signal on path 191-1, and generates at an active edge of clock signal CLK2 a residue signal as the difference of signal 111 (Vin) and the analog signal received on path 267 (Vdac). It may thus be appreciated that the residue signal represents the unresolved portion of the input signal for the corresponding sampling time instant.

Amplifier 280 amplifies the residue signal (Vin-Vdac) received on path 278 and provides an amplified residue signal on path 112. The (amplified) residue signal on path 112, thus, represents an amplified unresolved strength of input signal 111, and may be used to resolve the remaining bits in the N bit digital code by the subsequent stages.

Subtractor 270, DAC 260, and amplifier 280 may be implemented using a capacitor network and an operational amplifier according to one of several techniques such as charge redistribution stage, flip around charge redistribution stage etc., well known in the relevant arts.

As noted above, timing offset errors and voltage offset errors associated with a sub-ADC (e.g., flash ADC 250 of stage 120-1 of FIG. 2) of pipeline ADC 100 may result in errors in the generated sub-codes and the overall digital code (path 146). Several aspects of the present invention correct for such deviations (in general termed offset errors) as described next with respect to a flowchart.

Generally, such errors cause one or more values (residue values) of the residue signals generated by stage 120-1 to fall outside an "expected range" (described in detail below with respect to FIG. 3). In a prior technique, a subsequent stage 120-2 is designed to accept such "out-of-range" residue signals, and to correct/compensate for the errors internally (i.e., within stage 120-2).

However, such an implementation often requires additional hardware within stage 120-2 and/or is more wasteful (larger) in terms of power consumption and implementation area. Further, such a prior technique may also require the subsequent stage to be implemented to accept a very large range of residue values outside the normal/expected range. The prior approach noted above may not be desirable at least for reasons such as cost, implementation area, power consumption etc.

Figure 3:
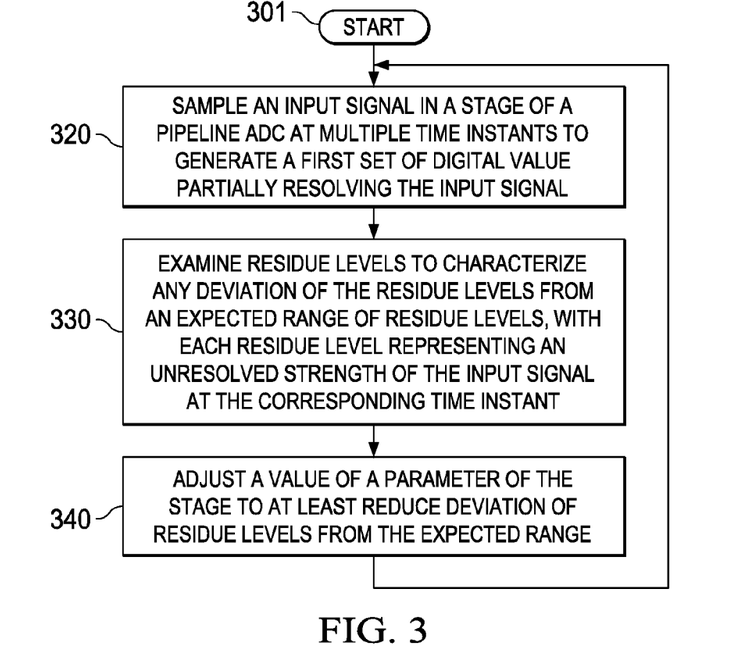
FIG. 3 is a flowchart illustrating the manner in which offset errors in a pipeline ADC are corrected in an embodiment of the present invention.

FIG. 3 is a flowchart illustrating the manner in which offset errors in a pipeline ADC are corrected in an embodiment of the present invention. The flowchart is described with respect to stage 120-1 of pipeline ADC 100, and offset correction block 180 (FIG. 1), merely for illustration. However, various features can be implemented in other environments and other components. Furthermore, the steps are described in a specific sequence merely for illustration. The flowchart starts in step 301, in which control passes immediately to step 320.

In step 320, stage 120-1 samples an input signal at multiple time instants to generate a first set of digital values (sub-codes in the description above). Each value in the first set is a partially resolved (generally the higher order or more significant bits of the final overall digital code) representation of the input signal. Control then passes to step 330.

In step 330, offset correction block 180 examines residue values corresponding to stage 120-1 to characterize any deviation of the residue values from an expected range of residue values. Each residue value represents an unresolved strength of the input signal at the corresponding time instant, and the expected range generally represents a range of values that the residue values would span assuming there were no offset errors. A residue value falling outside the expected range is indicative of an offset error.

The deviation can be characterized in various ways. Aspects such as magnitude of the deviations, the frequency of the deviations may be considered in characterizing the deviations (which can be represented as one or more parameters, using techniques well known in the relevant arts). Offset correction block 180 may examine the deviation (error) values of a multiple number of such residue values (having values outside the expected range) to determine the extent of offset error, as described below with examples. Control then passes to step 340.

In step 340, offset correction block 180 adjusts a value of a parameter(s) of stage 120-1 to at least reduce the deviation (if any) of residue values from the expected range, thereby minimizing (or reducing to zero) the offset error. Control then passes to step 320, and steps 320, 330 and 340 are repeated, in which subsequent portion of an analog signal is processed with the adjusted parameter.

Thus, it may be appreciated that offset correction block 180 may adjust the parameter(s) continuously/repeatedly to maintain the offset error at a zero or minimum value.

The manner in which an example embodiment of offset correction block 180 corrects the offset error is described in detail below. First, a description of some example offset errors in a pipeline ADC is provided.

Figure 4:
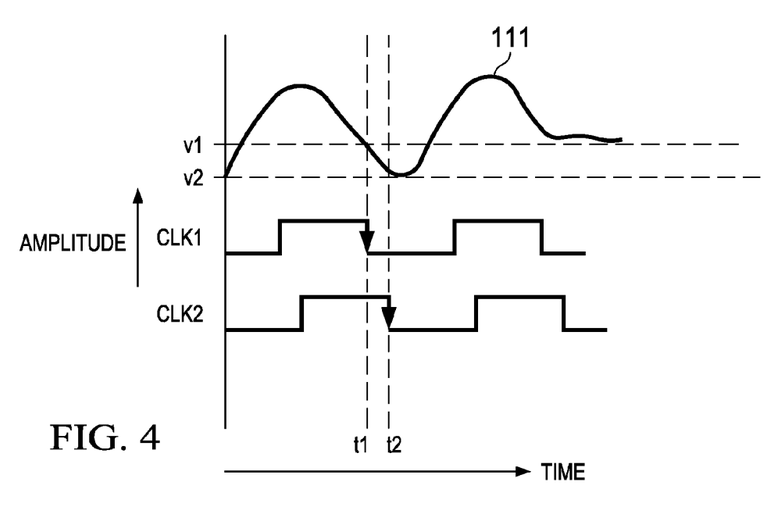
FIG. 4 is a diagram which illustrates an example of a timing offset error in a pipeline ADC.

FIG. 4 is a diagram which illustrates an example of a timing offset error in a pipeline ADC. Waveform 111 is assumed to be an input signal present on path 111 of ADC 100 of FIGS. 1 and 2). Clock signal CLK1 represents a clock provided to flash ADC 250 on path 191, while clock signal CLK2 is a clock provided to subtractor 270. Both clock signals CLK1 and CLK2 may be derived from a master clock (not shown), and are assumed to be contained in path 191-1.

In FIG. 4, the active edges of clock signals CLK1 and CLK2 (time instants at which flash ADC 250 and subtractor sample input signal 111) are shown occurring at time instants t1 and t2 respectively. Thus, instead of sampling the same value of the input signal 111 (as ideally desirable), flash ADC 250 and subtractor 270 sample different values v1 and v2, and may cause a resulting digital code to be erroneous. The difference between time instants t1 and t2 represents a timing offset error.

In other scenarios, a timing offset error may exist even if active edges of clock signals CLK1 and CLK2 are synchronous (occur at the same instants), but the internal paths (in flash ADC 250 and subtractor 270) traveled by signal 111 may be different (longer in one than the other). Various other causes for such errors are also possible, but not described here.

In general, a timing offset error may be deemed to exist if the signal value corresponding to a sampling instant of input signal 111 sampled by flash ADC 250 and subtractor 270 are different. Similar timing offset errors may also exist in other stages of pipeline ADC 100.

A timing offset error may cause at least some residue values generated by a stage to have values falling outside an 'expected range'. Offset correction block 180 may therefore examine the values of residue values (residue signals) to determine whether a timing offset error is present or not. An example scenario to illustrate how at least some residue values may fall outside an expected range due to a timing offset error is described next.

Figure 5A:
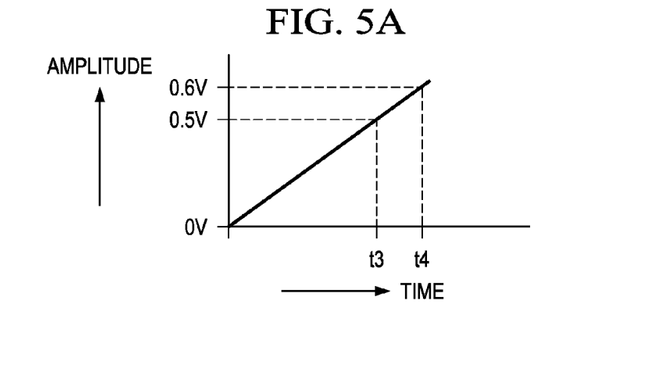
FIGS. 5A, 5B and 5C are example diagrams used to illustrate how some residue values may fall outside an expected range due to timing offset error.
Figure 5B:
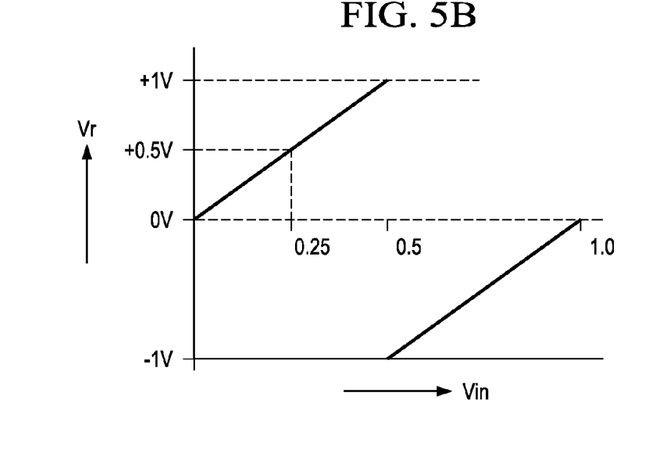
Figure 5C:
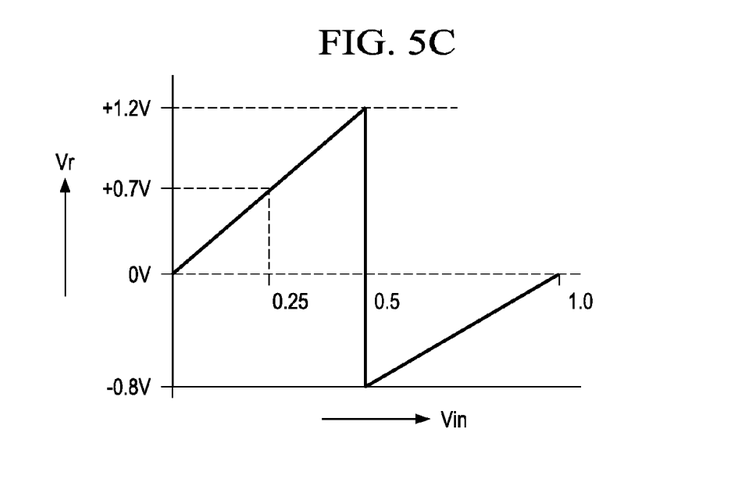

FIGS. 5A, 5B and 5C are example diagrams used to illustrate how at least some residue values may fall outside an expected range due to timing offset error. For convenience, the diagrams are used in conjunction with FIG. 2 in the following illustration. Merely for the sake of simplicity, it is assumed in the following description that flash ADC 250 provides a single bit representation of input signal 111 (Vin).

It is also assumed that the switching threshold for the single bit output is 0.5V (volts) such that the output of flash ADC 250 is a digital 0 when input Vin is less than 0.5V, and a digital 1 when input Vin is greater than or equal to 0.5 V. The output of DAC 260 is assumed to be 0V for an input of digital 0, and an output of 1V for an input of digital 1. The gain of amplifier 280 is assumed to be two.

FIG. 5A shows amplitudes of an example input signal (on path 111, assumed to be a ramp signal for simplicity) plotted against time.

FIG. 5B is a plot of input signal (111) magnitude (on X axis) versus output (on path 112 of FIG. 2) residue value (on Y axis), when the active (sampling) edges of clock signal CLK1 provided to flash ADC 250 and clock signal CLK2 provided to subtractor 270 occur at the same time instant, i.e. there is no timing offset error.

To illustrate, at a time instant when input 111 has a value 0.25V, output of flash ADC 250 is 0 and consequently signal on path 267 is 0V. Since both flash ADC 250 and subtractor 270 sample input 111 at the same time instant input to subtractor 270 also has a value of 0.25V. Thus, the signal on path 278 has a value 0.25V, and residue voltage on path 512 is 0.5V (due to the gain of 2 in amplifier 280), as shown in FIG. 5B.

As Vin approaches 0.5V, Vr approaches +1V. When Vin is 0.5V, output of flash ADC 250 is a digital 1, signal on path 267 is 1V, and signal on path 278 is −0.5V, with Vr (512) being −1V. As may be readily verified, the maximum range over which residue signal Vr varies for an input signal range of 0 to 1V is −1V to +1V (the expected range).

FIG. 5C is a plot of input signal (111) magnitude (on X axis) versus output (on path 112 of FIG. 2) residue value (on Y axis), when the active (sampling) edges of clock signal CLK1 provided to flash ADC 250 and clock signal CLK2 provided to subtractor 270 (or in general, to the circuitry (generally termed MDAC—multiplying digital to analog converter) implementing the circuit blocks DAC 260, subtractor 270 and amplifier 280) are not synchronous, i.e. there is a finite timing offset error. It is assumed that the sampling instant of subtractor 270 occurs slightly later (at time instant t4 in FIG. 5A) than the sampling instant (t3 in FIG. 5A) of flash ADC 250 such that value of input signal (ramp shown in FIG. 7A) sampled by subtractor 270 is 0.1V greater than the value sampled by flash ADC 250.

To illustrate, at a time instant when input 111 has a value 0.25V, output of flash ADC 250 is 0 and consequently signal on path 267 is 0V. Since subtractor 270 samples input 111 at a slightly later time instant such that the sampled value is 0.1V higher (i.e., 0.35V) the signal on path 278 has a value 0.35V, and residue voltage on path 112 is 0.7V (due to the gain of 2 in amplifier 680), as shown in FIG. 5B.

As Vin approaches 0.5V, Vr approaches +1.2V. When Vin is 0.5V, output of flash ADC 250 is a digital 1, signal on path 267 is 1V, and signal on path 678 is −0.4V, with Vr (112) being −0.8V. As may be readily verified, the maximum range over which residue signal Vr varies for an input signal range of 0 to 1V is −0.8V to +1.2V.

It may be observed from FIG. 5C that when a timing offset is present (non-zero value), some residue signals may have values outside the expected range o +1V to −1V. In general, the maximum range over which the residue signal Vr varies is different from the expected range, and may be larger. The extent of deviation (in both positive and negative values) may depend on the value of timing offset error (extent by which time instant t2 of FIG. 4 is earlier or later than t1). With respect to the example described above the residue values may vary between +1.2V and −1.2V (as against +1V and −1V when there is no timing offset).

The example scenario described above with respect to FIGS. 5A-5C assumed that Flash ADC 250 provides a single-bit output. In the general scenario in which Flash ADC 250 provides multiple-bit outputs, there may be a timing mismatch between sampling instants of each comparator used within Flash ADC 250 and the corresponding MDAC. Several aspects of the present invention operate to correct error even in such a general scenario, as will be clear on reading the disclosure herein.

According to an aspect of the present invention, offset correction block 180 examines the residue values to determine if any of the residue values are outside the expected range. The manner in which offset correction block 180 performs correction for the offset error based on the 'out-of-expected-range' residue value(s) in one embodiment of the present invention is described below.

In general, offset correction block 180 characterizes any deviations of the residue values outside of an expected range of residue values. One possible characterization is a determination by offset correction block 180 of a maximum range over which the residue signal varies. Offset correction block 180 may then, based on a deviation of the maximum range from the expected range, adjust one or more parameters causing the offset error (phase of clock signal CLK1 or clock signal CLK2 in the above example) to reduce the error (i.e., to bring the maximum range of a set of successive samples to at least substantially equal the expected range).

It may also be noted from the description above that sub-components of a stage may have to be designed to accommodate a wider range of the signals (input and/or output) handled by the sub-components. For example, amplifier 280 of stage 120-1 may have to amplify a wider range of input signals. Similarly, since the range of residue values of stage 120-1 may be larger than when there is no offset error, flash ADC, DAC, subtractor and amplifier of stage 120-2 may also need to handle/process a correspondingly wider range of signals.

However, in contrast to the prior technique noted above, flash ADC, DAC, subtractor and amplifier of stage 120-2 need be designed/implemented to accommodate a wider range (wider than the expected range) wide enough so that offset correction block 180 can detect that one or more residue values of stage 120-1 has gone out of the expected range. This may be appreciated from the description of the flowchart of FIG. 3, according to which closed loop feedback is employed for correcting the errors.

Accordingly, the description is continued with an illustration a pipeline ADC in an embodiment of the present invention, illustrating also the details of an offset correction block used therein.

Figure 6:
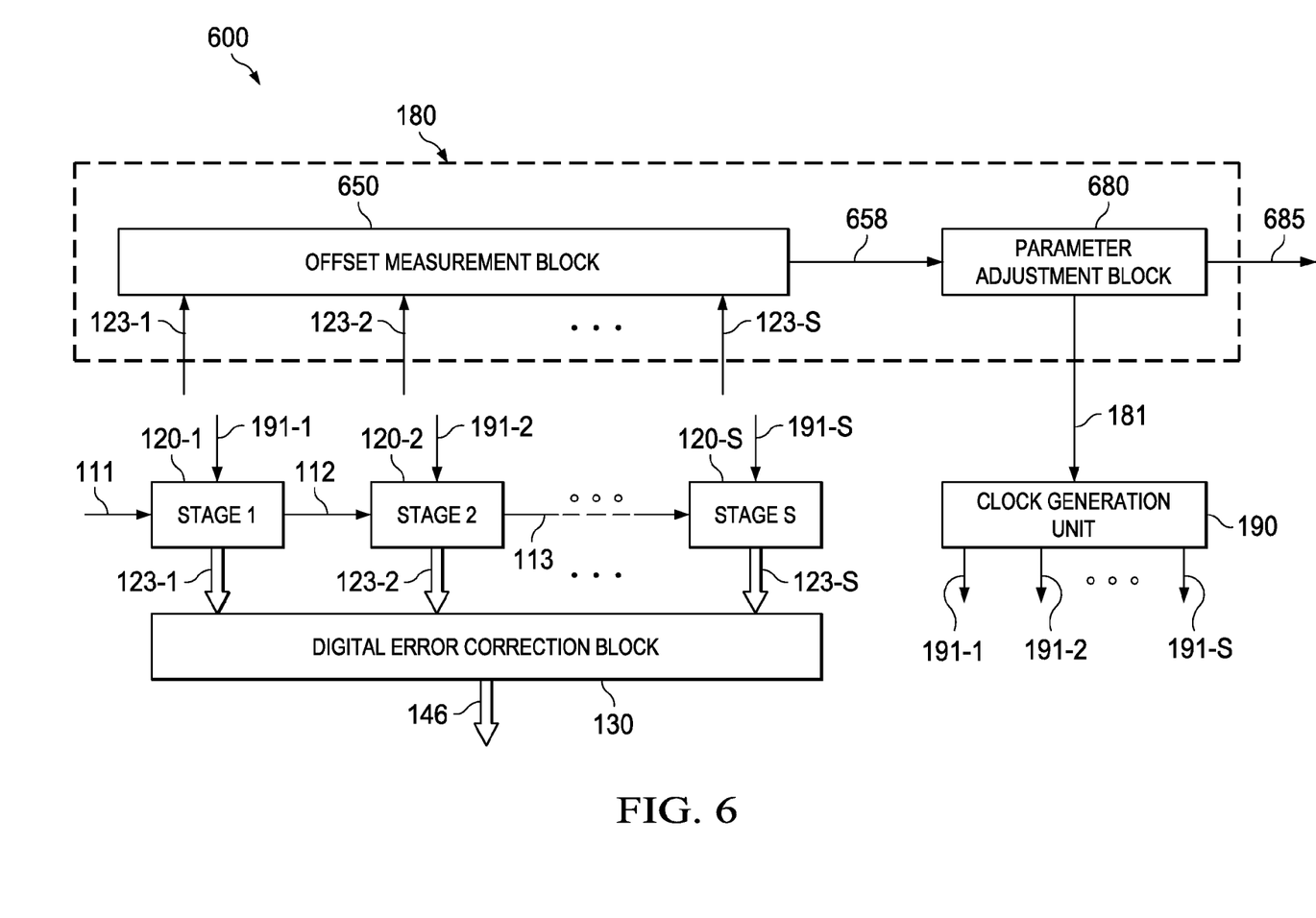
FIG. 6 is a block diagram of a pipeline ADC in an embodiment of the present invention.

FIG. 6 is a block diagram of a pipeline ADC in another embodiment of the present invention. Pipeline ADC 600 is shown containing stages 120-1 through 120-S, digital error correction block 130, offset correction block 180 and clock generation unit 190. Each block is described below in further detail.

For example, assuming that the offset errors in stage 120-1 are sought to be corrected and each of stages 120-1 and 120-2 is implemented using the components of FIG. 2, subtractor 270 and amplifier 280 would need to be implemented to provide the wider range of signal depicted in FIG. 5C. Similarly, flash ADC 250 of stage 120-2 would need to provide digital values representing the wider range of FIG. 5C.

Thus, stage 120-2 may be implemented with more bits than the sub-code sought to be generated using the stage, or appropriate external processing to scale the digital values back to the range of FIG. 5B may be employed, as will be apparent to one skilled in the relevant arts. For the remaining description it is assumed that the sub-codes generated by stage 120-2 reflect the specific strength of the signal 612, within the range (−1.2V to +1.2V) as illustrated with respect to FIG. 5C.

Offset correction block 180 is shown containing offset measurement block or offset measurement circuit 650 and parameter adjustment block 680. Offset measurement block 650 receives the sub-codes from each of the stages 120-1 through 120-S via corresponding paths 123-1 through 123-S, and determines if any of the values are outside an expected range. The expected range may be determined a priori based on implementation details of the corresponding stage, as noted above with respect to FIG. 5B. It may be noted that the sub-code generated in a stage (except the first stage 120-1) corresponds to the residue of an immediately previous stage. Though the digital code generated by only a single subsequent stage is described as being used in determining the maximum range, it should be appreciated that the sub-codes of multiple subsequent stages together can be examined if more precision is desired.

Thus, in the illustrative example, offset measurement block 650 may examine the sub-codes (corresponding to the range of FIG. 5C) received from stage 120-2 on path 123-2. Offset measurement block 650 processes the error information (extent by which residue values exceed the upper or lower limit of the expected range) and provides a corresponding correction/adjustment value on path 658 to parameter adjustment block 680. Offset measurement block 650 may also examine sub-codes from other stages and provide corresponding correction/adjustment information to parameter adjustment block 680 via path 658.

Parameter adjustment block 680 receives the adjustment information corresponding to one or more stages on path 558, and generates corresponding signals on path 181 (provided to clock generation block 190 to adjust one or more clock phases to correct for timing offset error), and on path 685 to correct for other sources of offset errors described in greater detail below.

It must be understood that although the embodiment of FIG. 6 is shown as not having a sample and hold amplifier (SHA), various aspects of the present invention are applicable and operational even when a SHA is present. In such embodiments, a SHA samples input signal 111, and provides the sampled signal to stage 120-1.

Thus, both the flash ADC and MDAC contained within stage 120-1 receive a sample of input signal 111 from the SHA (not shown). In alternative embodiments, only the MDAC receives the output (sample) of the SHA, while the flash ADC receives the input signal 111 directly (without being sampled by the SHA). In yet another embodiment, two SHAs may be used, with one SHA providing a sample of the input signal to the flash ADC and the other SHA providing a sample of the input signal to the MDAC.

A procedure/algorithm used by offset measurement block 650 and parameter adjustment block 190 to correct for timing offset error in an embodiment of the present invention is briefly described next.

Figure 7:
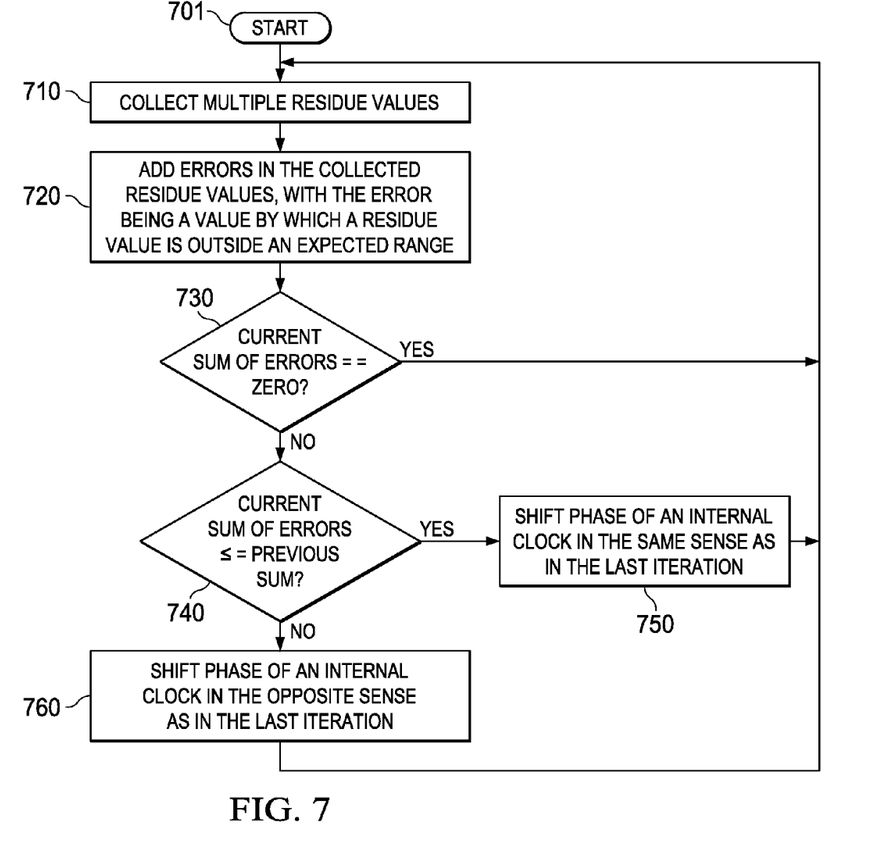
FIG. 7 is a flowchart illustrating a procedure according to which timing offset error may be corrected in an embodiment of the present invention.

FIG. 7 is a flowchart illustrating the manner in which offset measurement block 650 and parameter adjustment block 190 correct for timing offset error in an embodiment of the present invention. The steps are described in a specific sequence and with respect to correction for stage 120-1, merely for illustration. Different sequence of steps can also be implemented without departing from the scope and spirit of several aspects of the present invention, as will be apparent to one skilled in the relevant arts by reading the disclosure provided herein. The flowchart starts in step 701, in which control passes immediately to step 710.

In step 710, offset measurement block 650 collects multiple residue values generated by stage 120-1 by storing sub-codes generated by the sub-ADC of the subsequent stage (Flash ADC of stage 120-2). Offset measurement block 650 may collect the sub-codes corresponding to several cycles (e.g., 1000). Control then passes to step 720.

In step 720, offset measurement block 650 adds the errors in the collected residue values. The error for each sample is a magnitude (absolute value, disregarding the sign) by which a residue value is outside an expected range. For example, if the expected range is +1V to −1V, and a sub-code corresponds to a value of +1.1V, the error is 0.1V. It may be noted that typically, only a small fraction of the multiple number of residue values may have values outside the expected range. Control then passes to step 730.

In step 730, offset measurement block 650 determines if the current sum of errors (computed in a current iteration of step 720) is equal to zero. If the current sum is zero, the residue values all lie within the expected range, and control then passes to step 710, in which offset measurement block 650 collects another set of residue values (sub-codes) to continue monitoring for possible offset error. If the current sum is not zero, control passes to step 740.

In step 740, offset measurement block 650 determines if the current sum of errors is less than or equal to an immediately previous sum. Offset measurement block 650 provides such information to parameter adjustment block 190. If the current sum is less than or equal to the previous sum control passes to step 750, else control passes to step 760.

In step 750, parameter adjustment block 190 shifts the phase of one of the internal clock signals of stage 120-1 (similar to clock signals CLK1/CLK2 in the embodiment of FIG. 2, but referred for ease of description below by the same numbers) in the same sense (advance or retard) as in a previous iteration. It must is noted here, that in a first iteration of the steps described here, it may not be possible to determine the direction (retard/advance) in which the phase of the clock has to changed based on the difference between the current sum and the previous sum (not available in the first iteration), and parameter adjustment block 190 may either retard or advance the phase. Control then passes to step 710, in which offset measurement block 650 collects another set of sub-codes, and the appropriate subsequent steps are repeated.

In step 760, parameter adjustment block 190 shifts the phase of the internal clock in the opposite sense as in a previous iteration. Control then passes to step 710, in which offset measurement block 650 collects another set of sub-codes, and the appropriate subsequent steps are repeated. The current sum now equals the previous sum for that subsequent iteration.

It may be appreciated that a timing offset error may be dynamic, i.e., the offset error may change over an operating period of pipeline ADC 600, and offset measurement block 650/parameter adjustment block 190 may perform the operations above continuously/repeatedly to constantly minimize the offset error or reduce the offset error to zero.

It has been assumed in above description that all comparators of the sub-ADC have the same sampling time mismatch with respect to the MDAC sampling instant. In general, each of the comparators can have different sampling instants, and each of the timing mismatches may be corrected in a manner similar to that described above.

Further, as noted above, the components of a stage need be designed/implemented to accommodate wider signal ranges only wide enough to enable offset correction block 180 to detect that residue values are outside the expected range.

Another instance of an offset error in a pipeline ADC occurs when voltage thresholds in a flash ADC (such as flash ADC 650 of FIG. 6) used in the pipeline ADC are different from set ('ideal') values, as described next.

Figure 8:
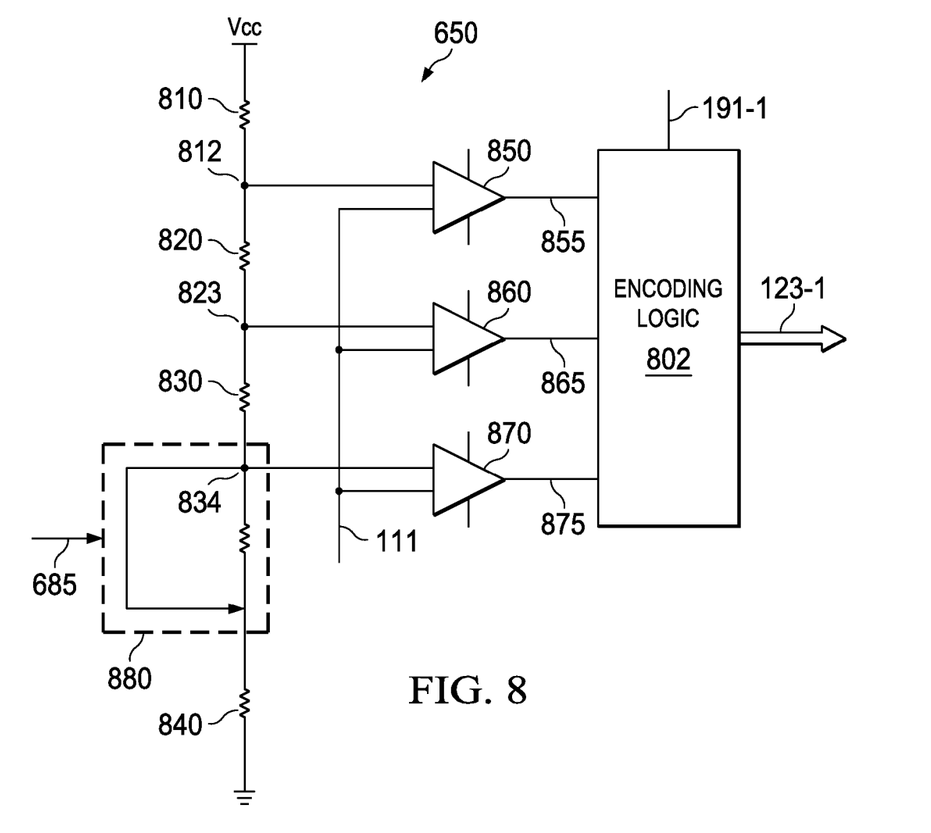
FIG. 8 is a block diagram of the internal details of a flash ADC used in stage of a pipeline ADC in an embodiment of the present invention.

FIG. 8 is a block diagram of the internal details of a flash ADC used in a pipeline ADC in an embodiment of the present invention. Flash ADC 650 is shown containing resistors 810, 820, 830 and 840, comparators 850, 860, 870 and digital potentiometer 880.

As is well known in the relevant arts, comparators 850, 860 and 870 provide a comparison output (respective paths 855, 865 and 875) of input 890 against respective threshold voltages at nodes 812, 823 and 834. Outputs 855, 865 and 875 may be further processed in an encoding logic 802 to provide the output sub-codes (path 123-1 in FIG. 2). Offset correction block 180 may adjust the threshold voltage at node 834 via path 685 to correct for a voltage offset error as described below. Voltages at nodes 812 and 823 may also be adjusted in a similar fashion, by corresponding circuitry not shown.

As noted, threshold voltages may differ from set values. For example, assuming the circuit of FIG. 8 operates from a 4 volt supply (marked Vcc in the FIG.), the magnitudes of resistors 810, 820, 830 and 840 may be selected to provide threshold voltages of 1V, 2V and 3V respectively at nodes 834, 823 and 812.

Though only the comparator 870 is shown with variable resistor input (due to operation of 880), other input resistors also may be provided with a variable value to facilitate voltage offset correction according to an aspect of the present invention.

Due to variations in process, temperature etc, the threshold voltages may be different from the desired values. In other scenarios, the comparators may have errors internally causing switching to occur at voltages other than 'ideal' values.

In effect, errors mechanisms including those noted above cause voltage thresholds at which a flash ADC in a stage of a pipeline ADC switches from output sub-code to a different one, and the errors are collectively termed voltage offset errors. Voltage offset errors in a stage of a pipeline ADC also cause errors in the overall codes of a pipeline ADC.

Voltage offset errors in a flash ADC of a pipeline ADC also cause at least some residue values to fall outside an expected range. According to an aspect of the present invention, offset correction block 180 checks for residue values outside an expected range and operates to correct for the voltage offset error, as described next with respect to a correction procedure in one embodiment of the present invention.

Figure 9:
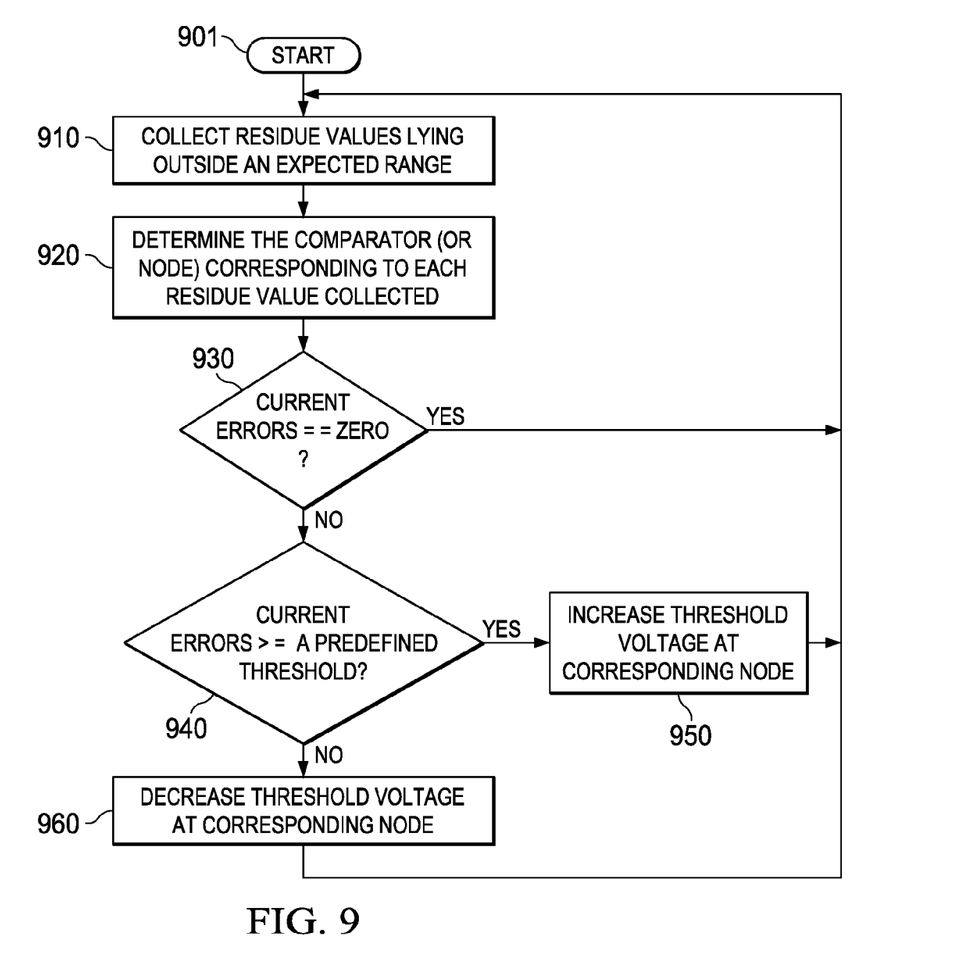
FIG. 9 is a flowchart illustrating a procedure according to which voltage offset error may be corrected in an embodiment of the present invention.

FIG. 9 is a flowchart illustrating the manner in which offset measurement block 650 and parameter adjustment block 680 correct for voltage offset error in an embodiment of the present invention. The steps are described in a specific sequence and with respect to correction for stage 120-1, merely for illustration. Different sequence of steps can also be implemented without departing from the scope and spirit of several aspects of the present invention, as will be apparent to one skilled in the relevant arts by reading the disclosure provided herein. The flowchart starts in step 901, in which control passes immediately to step 910.

In step 910, offset measurement block 650 collects residue values lying outside an expected range (i.e., residue values having an error). Control then passes to step 920.

In step 920, offset measurement block 650 determines the comparator (or node) corresponding to each residue value (with error) collected in step 910. In an embodiment, offset measurement block 650 makes such a determination by examining sub-codes received from both stage 120-1 as well as 120-2.

In general, the specific one of the comparator/resistor forming the basis for the sub-code generation is determined to be the comparator/resistor pair causing the voltage offset error. For example, assuming a digital sub-code of 2 in the operation of the circuit of FIG. 8, both comparators 870 and 860 would generate a value of 1 and comparator 850 would generate value of 0. Thus, one of comparators 860 or 850 is deemed to be the comparator causing the voltage offset. Sub-code from next sub-stage may be analyzed to determine whether comparator 850 or 860 is in error. Control then passes to step 930.

It should be appreciated that steps 930, 940, 950 and 960 are repeated for each of the resistors 810, 820, 830 and 840.

In step 930, offset measurement block 650 checks if the errors collected in step 910 are equal to zero (i.e., no residue values with errors were collected) for the corresponding resistor/comparator pair. If no residue values have errors, this indicates that there is no voltage offset error for that resistor/comparator pair, and control then passes to step 910, and operations of the corresponding steps are again performed. It may however be noted that voltage offset error is typically a static error, which may need correction only once.

In step 940, offset measurement block 650 checks whether the number of errors is greater than a predefined threshold for the corresponding resistor/comparator pair. The predefined error threshold may be set to a non-zero value to account for noise effects. For example, if the residue is within the expected range but has a value lying very close to the edge/boundary of the expected range, noise may cause the residue value to cross the expected range, which would in turn cause a correction to be applied, which may not be desirable. If the number of errors is greater than the predefined threshold, control passes to step 950, otherwise control passes to step 960.

In step 950, parameter adjustment block 680 increases the threshold voltage at the corresponding node. For example, if in step 920, the node corresponding to the error was determined to be node 834, parameter adjustment block 680 may increase the threshold voltage (which is the parameter of interest) at node 834 via potentiometer 880 (controlled via path 685). Control then passes to step 910, and the steps may be repeated.

In step 960, parameter adjustment block 190 decreases the threshold voltage at the corresponding node. For example, if in step 920, the node corresponding to the error was determined to be node 834, parameter adjustment block 190 may decrease the threshold voltage at node 834 via potentiometer 880 (controlled via path 685). Control then passes to step 910, and the steps may be repeated.

Thus, a pipeline ADC implemented according to several aspects of the present invention may correct for offset errors, by examining residue values, and adjusting one or more parameters causing the errors. It may be noted that multiple types of offset errors (e.g., both timing and voltage offset errors) may be present at the same time. In such scenarios offset correction block 180 may attempt to correct for the offsets in an iterative fashion, correcting for errors of one type (e.g., timing offset) till the error is minimized to some value, then proceed to correct for errors of other type. Alternatively, correction for both timing as well as voltage threshold offset errors may be applied concurrently.

A pipeline ADC implemented according to techniques described above may be incorporated in a system or a device, as described next.

Figure 10:
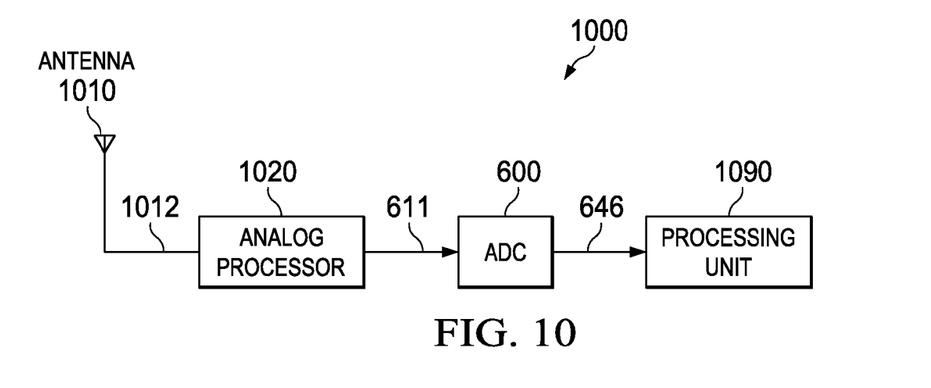
FIG. 10 is a block diagram of an example system/device in which the present invention may be implemented.

FIG. 10 is a block diagram of receiver system 1000 illustrating an example system in which the present invention may be implemented. Receiver system 1000, which may correspond to, for example, a mobile phone is shown containing antenna 1010, analog processor 1020, ADC 600, and processing unit 1090. Each component is described in further detail below.

Antenna 1010 may receive various signals transmitted over a wireless medium. The received signals may be provided to analog processor 1020 on path 1012 for further processing. Analog processor 1020 may perform tasks such as amplification (or attenuation as desired), filtering, frequency conversion, etc., on received signals and provides the resulting signal on path 111.

ADC 600 converts the analog signal received on path 610 to corresponding digital codes. ADC 600 is a pipeline ADC implemented in a manner described above, and may correct for offset errors as described above. ADC 600 provides the digital codes to processing unit 1090 on path 646 for further processing. Processing unit 1090 receives the recovered data to provide various user applications (such as telephone calls, data applications).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. A method comprising:
 in a first stage, sampling an input signal in synchronization with a first clock signal;
 in the first stage, converting the input signal at into a first set of digital values;
 in the first stage, generating a residue signal in synchronization with a second clock signal
 in a second stage, generating a second set of digital values at least in part from the residue signal;
 examining each residue value to determine whether there is deviation from an expected range of residue values; and
 adjusting the phase of at least one of first clock signal and the second clock signal to at least reduce the deviation from the expected range.

2. The method of claim 1, wherein the step of generating the residue signal in the first stage further comprises:
 converting the first set of digital values into an intermediate signal;
 subtracting the intermediate signal from the input signal in synchronization with the second clock signal; and
 amplifying the result of the subtraction of the intermediate signal and the input signal to generate the residue signal.

3. The method of claim 1, wherein the method further comprises the step of adjusting at least one threshold voltage in the first stage to at least reduce the deviation from the expected range.

4. A pipeline ADC comprising:
 a first stage that samples an input signal in synchronization with a first clock signal so as to generate a first set of digital values and that generates a residue signal in synchronization with a second clock signal;
 a second stage that is coupled to the first stage, that receives the residue signal, and that generates a second set of digital values; and
 an offset correction circuit that is coupled to the first and second stages, wherein the offset correction circuit determines whether any residue values deviate from an expected range of residue values, and wherein the offset correction circuit adjusts the phase of at least one of the first and second clock signals to at least reduce deviation from the expected range.

5. The pipeline ADC of claim 4, wherein the first stage further comprises:
 a flash ADC that samples the input signal and generates the first set of digital values in synchronization with the first clock signal;
 a digital to analog converter (DAC) that is coupled to the flash ADC and that generates an intermediate analog signal; and
 a subtractor that is coupled to the DAC, wherein the subtractor generates the residue signal in synchronization with the second clock signal.

6. The pipeline ADC of claim 4, wherein the pipeline ADC further comprises a clock generation circuit that generates the first and second clock signals.

7. The pipeline ADC of claim 6, wherein the offset correction circuit further comprises:
 an offset measurement circuit that is coupled to the first and second stages so as to receive the first and second sets of digital values; and
 a parameter adjustment circuit that is coupled to the offset measurement circuit and the clock generation circuit, wherein the parameter adjustment circuit is adapted to provide phase adjustment signals to the clock generation circuit.

8. A pipeline ADC comprising:
 a first stage having a first flash ADC, wherein the first stage samples an input signal in synchronization with a first clock signal so as to generate a first set of digital values and that generates a residue signal in synchronization with a second clock signal;

a second stage having a second flash ADC, wherein the second stage is coupled to the first stage, that receives the residue signal, and that generates a second set of digital values; and an offset correction circuit that is coupled to the first and second stages, wherein the offset correction circuit determines whether any residue values derived from the first stage deviates from an expected range of residue values, and wherein the offset correction circuit adjusts the phase of at least one of the first and second clock signals to at least reduce deviation from the expected range.

9. The pipeline ADC of claim 8, wherein the first stage further comprises:

a DAC that is coupled to the first flash ADC and that generates an intermediate analog signal; and a subtractor that is coupled to the DAC, wherein the subtractor generates the residue signal in synchronization with the second clock signal.

10. The pipeline ADC of claim 8, wherein the pipeline ADC further comprises a clock generation circuit that generates the first and second clock signals.

11. The pipeline ADC of claim 10, wherein the offset correction circuit further comprises:

an offset measurement circuit that is coupled to the first and second stages so as to receive the first and second sets of digital values; and a parameter adjustment circuit that is coupled to the offset measurement circuit and the clock generation circuit, wherein the parameter adjustment circuit is adapted to provide phase adjustment signals to the clock generation circuit.

* * * * *